(12) United States Patent
Colijn

(10) Patent No.: US 9,550,246 B2
(45) Date of Patent: Jan. 24, 2017

(54) SELECTIVE SOLDERING SYSTEM

(71) Applicant: ILLINOIS TOOL WORKS INC., Glenview, IL (US)

(72) Inventor: Ton Colijn, Nieuwendijk (NL)

(73) Assignee: ILLINOIS TOOL WORKS, Glenview, IL (US)

( * ) Notice: Subject to any disclaimer, the term of this patent is extended or adjusted under 35 U.S.C. 154(b) by 0 days.

(21) Appl. No.: 14/442,733

(22) PCT Filed: Nov. 20, 2013

(86) PCT No.: PCT/US2013/070945
§ 371 (c)(1),
(2) Date: May 14, 2015

(87) PCT Pub. No.: WO2014/081792
PCT Pub. Date: May 30, 2014

(65) Prior Publication Data
US 2015/0336194 A1   Nov. 26, 2015

(30) Foreign Application Priority Data
Nov. 21, 2012   (DE) .................. 10 2012 022 669

(51) Int. Cl.
*B23K 37/00*   (2006.01)
*B23K 1/00*   (2006.01)
(Continued)

(52) U.S. Cl.
CPC ............ *B23K 1/0008* (2013.01); *B23K 1/085* (2013.01); *B23K 3/0653* (2013.01); *B23K 3/0669* (2013.01); *H05K 3/34* (2013.01)

(58) Field of Classification Search
None
See application file for complete search history.

(56) References Cited

U.S. PATENT DOCUMENTS 4,523,708 A * 6/1985 Minchev .............. B23K 3/0653
                                                          228/37
4,568,012 A * 2/1986 Kakuhata ............. B23K 3/0653
                                                          118/429
(Continued)

FOREIGN PATENT DOCUMENTS

BE   WO 0204161 A1 *   1/2002   ............. B23K 1/085
CA   WO 9417949 A1 *   8/1994   ............. B23K 1/085
(Continued)

OTHER PUBLICATIONS

ISR and WO for PCT/US2013/070945 mailed May 2, 2014.
DE Search Report for German Application No. 10 2012 022 669.1 mailed Oct. 23, 2013.

*Primary Examiner* — Kiley Stoner
(74) *Attorney, Agent, or Firm* — Hauptman Ham, LLP

(57) ABSTRACT

The invention relates to a selective soldering plant for the soldering of electronic circuit boards, at least one container for liquid solder, a soldering arrangement with at least one soldering nozzle and at least one pump for conveying the liquid solder to the soldering arrangement being provided, an inner shielding device for at least partially shielding the soldering arrangement upwardly with regard to a gas flow being provided above the soldering arrangement, and an inflow device being provided, through which gas, in particular protective gas, can in any event flow into the region below the inner shielding device. It is proposed that an outer shielding device for at least partially shielding the inner shielding device upwardly with regard to a gas flow be provided.

31 Claims, 3 Drawing Sheets

Figure 1:
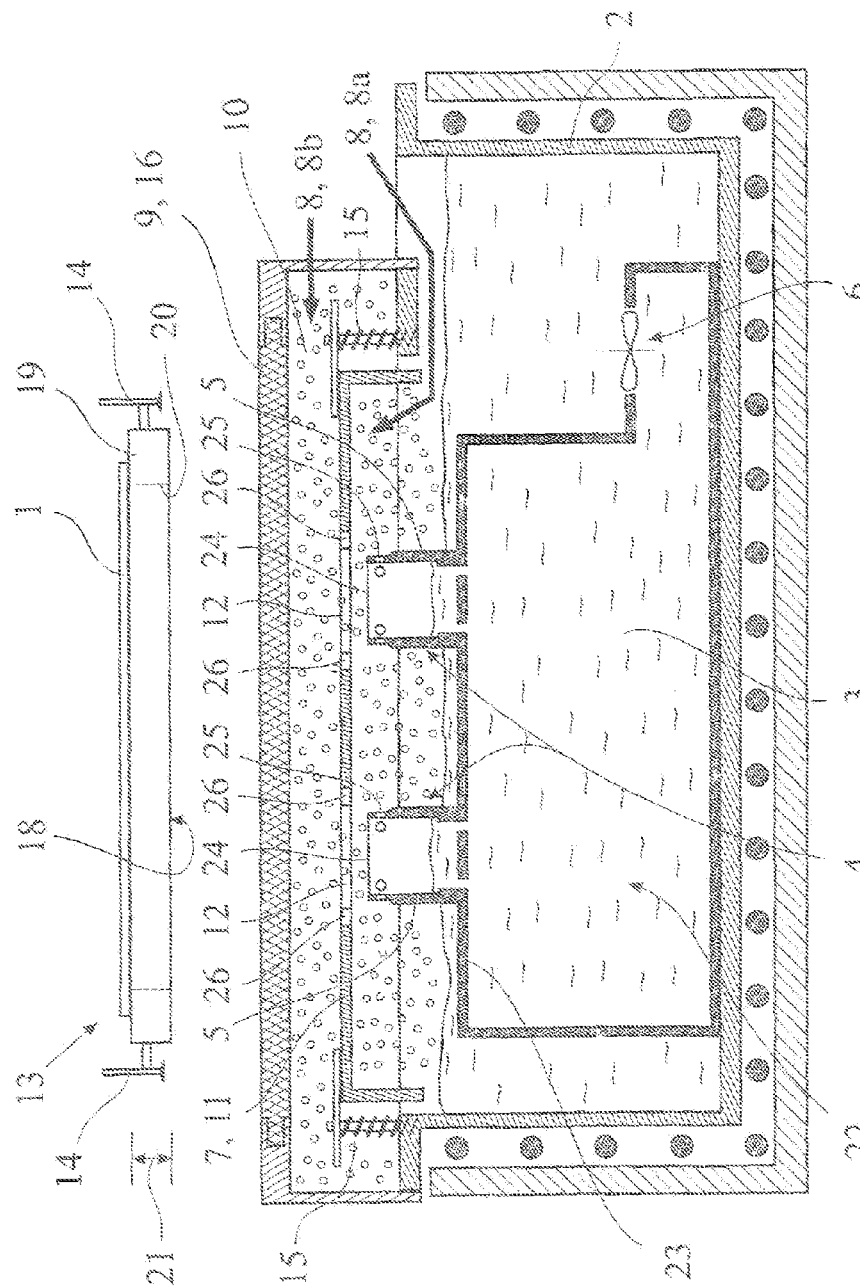

(51) Int. Cl.
*B23K 3/06* (2006.01)
*B23K 1/08* (2006.01)
*H05K 3/34* (2006.01)

(56) References Cited

U.S. PATENT DOCUMENTS

| | | | | |
|---|---|---|---|---|
| 4,779,790 A | * | 10/1988 | Wallgren | B23K 1/018 222/595 |
| 5,044,542 A | | 9/1991 | Deambrosio | |
| 5,048,746 A | * | 9/1991 | Elliott | B23K 1/085 228/180.1 |
| 5,156,324 A | * | 10/1992 | Hueste | B23K 1/085 228/180.1 |
| 5,203,489 A | * | 4/1993 | Gileta | B23K 3/0653 228/180.1 |
| 5,240,169 A | * | 8/1993 | Gileta | B23K 1/085 228/180.1 |
| 5,292,055 A | * | 3/1994 | Gileta | B23K 1/085 228/180.1 |
| 5,294,036 A | * | 3/1994 | Den Dopper | B23K 1/008 228/219 |
| 5,388,752 A | * | 2/1995 | Kawakatsu | B23K 1/085 228/20.1 |
| 5,397,049 A | * | 3/1995 | Gileta | B23K 1/085 228/37 |
| 5,409,159 A | * | 4/1995 | Connors | B23K 3/0653 228/219 |
| 5,411,200 A | * | 5/1995 | Connors | B23K 3/0653 228/219 |
| 5,769,305 A | * | 6/1998 | Takeda | B23K 3/0653 228/37 |
| 6,116,497 A | * | 9/2000 | Scheel | B23K 1/015 228/234.2 |
| 2001/0020637 A1 | * | 9/2001 | Zen | B23K 1/085 228/260 |
| 2002/0162879 A1 | | 11/2002 | Schouten et al. | |
| 2008/0067219 A1 | * | 3/2008 | Barengo | B23K 1/085 228/219 |
| 2008/0277457 A1 | * | 11/2008 | Mastele | B23K 3/0653 228/219 |
| 2008/0302861 A1 | * | 12/2008 | Szymanowski | B23K 3/0653 228/223 |
| 2009/0095793 A1 | * | 4/2009 | Tombs | F16C 37/00 228/56.1 |
| 2010/0059575 A1 | * | 3/2010 | Isler | B23K 1/085 228/219 |
| 2012/0055980 A1 | * | 3/2012 | Dong | B23K 3/0653 228/219 |
| 2013/0098974 A1 | * | 4/2013 | Dong | B23K 1/0016 228/219 |
| 2014/0027495 A1 | * | 1/2014 | Arslanian | B23K 3/082 228/37 |

FOREIGN PATENT DOCUMENTS

| | | | |
|---|---|---|---|
| CA | 2155351 A1 * | 9/1994 | ............... B23K 1/00 |
| DE | 2710791 A1 | 9/1978 | |
| DE | 69220810 T2 | 2/1998 | |
| DE | 20220971 U1 | 10/2004 | |
| DE | WO 2006037520 A1 * | 4/2006 | ............ B23K 1/085 |
| DE | 102006024192 A1 | 11/2007 | |
| DE | 102008047114 A1 | 4/2010 | |
| EP | 1946875 A1 | 7/2008 | |
| FR | EP 0713742 A1 * | 5/1996 | ............ B23K 1/085 |
| JP | 05329630 A * | 12/1993 | |
| JP | EP 0854001 A1 * | 7/1998 | .......... B23K 3/0646 |
| JP | 2004200575 A | 7/2004 | |

\* cited by examiner

SELECTIVE SOLDERING SYSTEM

RELATED APPLICATIONS

The present application is a National Phase of International Application Number PCT/US2013/070945 filed Nov. 20, 2013 and claims priority to German Application Number 10 2012 022 669.1 filed Nov. 21, 2012.

The invention relates to a selective soldering plant for the soldering of electronic circuit boards, according to the preamble of claim 1, and to a method for the soldering of electronic circuit boards, according to the preamble of claim 14.

In selective soldering, liquid solder is pumped by means of a pump into a nozzle which is located in a solder bath. When the solder is being pumped into the nozzle, a small soldering wave arises and flows out into the solder bath.

In the known selective soldering plant (DE 202 20 971 U1), on which the invention is based, the circuit board to be soldered is led over the soldering wave as a function of the circuit board layout. The handling of the circuit board usually takes place in an automated way via a corresponding handling system which is equipped with a gripper for the circuit board. Virtually any soldering tasks can consequently be performed at a low outlay in setting-up terms.

Liquid solder which comes into contact with air tends fundamentally to form dross. This applies to the soldering process itself and also to standby operation in which the solder is set aside in liquid form between two soldering processes. In order to suppress the formation of dross, it was proposed for the known selective soldering plant to act upon the surface of the liquid solder with a protective gas. In the design of such plants, it is important, on the one hand, to increase the protective gas fraction in the atmosphere in as definable a way as possible and, on the other hand, to have an efficient use of protective gas.

In one variant, there is provision in the known selective soldering plant for providing above the soldering arrangement a cover plate which has a recess for each soldering nozzle. In standby operation, a protective gas is induced to flow in underneath the covering layer in order to reduce the formation of dross. In order to carry out the soldering process, the cover plate is lowered, with the result that only the nozzle outlets of the soldering nozzles project out of the cover plate. The disadvantage of this, in the first place, is that protective gas which has flowed in can easily escape through the orifices in the cover plate, and therefore efficiency with regard to the protective gas is low. Furthermore, owing to the escape of protective gas, the build-up of the protective gas atmosphere is time-consuming. On the other hand, the protective gas content in the region of the soldering point is comparatively low.

As an alternative, it is proposed, with regard to the known selective soldering plant, to provide instead of the cover plate a kind of sliding door, by means of which the soldering arrangement can be closed off with high efficiency in standby operation. However, the soldering arrangement is completely exposed during the soldering process, and therefore the protective gas fraction in the region of the soldering point is once again low.

The problem on which the invention is based is to configure and develop the known selective soldering plant in such a way that a high protective gas fraction can be achieved at the soldering point, while at the same time protective gas is utilized efficiently.

In a selective soldering plant according to the preamble of claim 1, the above problem is solved by means of the features of the characterizing part of claim 1.

What is essential is the fundamental idea of shielding the soldering arrangement upwardly with regard to a gas flow by means of two shielding devices arranged one behind the other. Especially good results in terms of the ability to set the atmosphere at the soldering point can thereby be achieved.

The first, inner shielding device serves for at least partially shielding the soldering arrangement upwardly with regard to a gas flow. Upward shielding is especially important here, since, below this inner shielding device, an inflow device for gas, in particular protective gas, is provided. The protective gas here and preferably is nitrogen.

The second, outer shielding device serves, in turn, for at least partially shielding the region above the first, inner shielding device.

In the present case, upward shielding with regard to a gas flow plays a special part, since it is important essentially to hold a protective gas, such as nitrogen, under the shield, in order to ensure a low-oxygen atmosphere in the region of the respective soldering point. Such protective gases, in particular nitrogen, are lighter than air, and they would therefore rise upward without a shielding device.

A particular benefit of the proposed solution is shown, for example, when the inflow of the protective gas takes place when the outer shielding device is closed. This can ensure that only a small volumetric flow of protective gas has to flow in in order to achieve the desired low-oxygen atmosphere. The protective gas is of course, in any event, prevented from flowing out by the outer shielding device.

The build-up of the atmosphere necessary for the soldering process can consequently be implemented in an especially short time. To reinforce the above benefits, it is possible for protective gas to flow not only into the region below the inner shielding device, but also into the region above the inner shielding device. At the time of soldering, which in any event makes it necessary to open the outer shielding device, a low-oxygen atmospheric layer is then present, at least for a short time, above the inner shielding device, so that the likelihood of the presence of a low-oxygen atmosphere at the soldering point is increased by means of the proposed solution.

The preferred refinements according to claims 2 to 4 relate to the equipping of the inner shielding device with a cover plate which can be lowered for soldering operation. It is especially advantageous in the refinement according to claim 3 that the lowering of the cover plate is possible by means of the action of force of a gripper for the circuit board to be soldered. As a result, on the one hand, an actuator for lowering the cover plate can be dispensed with. On the other hand, optimal synchronization of lowering with the positioning of the circuit board to be soldered is ensured.

In the also preferred refinements according to claims 5 to 8, the outer shielding device is configured to be closable, claim 6 comprising a structurally especially simple implementation as a sliding door. In the also preferred refinement according to claim 7, partial closability of the outer shielding device is provided, so that the outwardly open region can be kept as small as possible by suitable activation.

By means of the preferred refinement according to claim 10, the atmosphere at the soldering point can be set especially accurately. It is essential in this case that the gripper forms, together with the circuit board to be soldered, a hood-like arrangement for at least partially closing off the cover plate. During the lowering of the gripper and the accompanying lowering of the cover plate, admittedly, the individual soldering nozzles are exposed. However, the exposed parts from the soldering nozzles are, of course, located inside the newly formed hood-like arrangement, so that an escape of protective gas from the soldering nozzles can be largely suppressed.

Pursuant to further teaching according to claim 14, which assumes independent significance, a method for the soldering of electronic circuit boards by means of an above selective soldering plant is claimed.

It is essential, pursuant to this further teaching, that, with the outer shielding device closed, protective gas is in any event induced by means of the inflow device to flow into the region below the inner shielding device, and that the outer shielding device is opened and the circuit board to be soldered is positioned at the soldering arrangement by means of a gripper.

It is essential, pursuant to this further teaching, that a predetermined atmosphere can first be provided, with the outer shielding device closed, and that only thereafter the outer shielding device is opened and the circuit board to be soldered is positioned. It was explained further above that the desired atmosphere at the soldering point can thereby be generated with high likelihood and in a short time.

Figure 2:
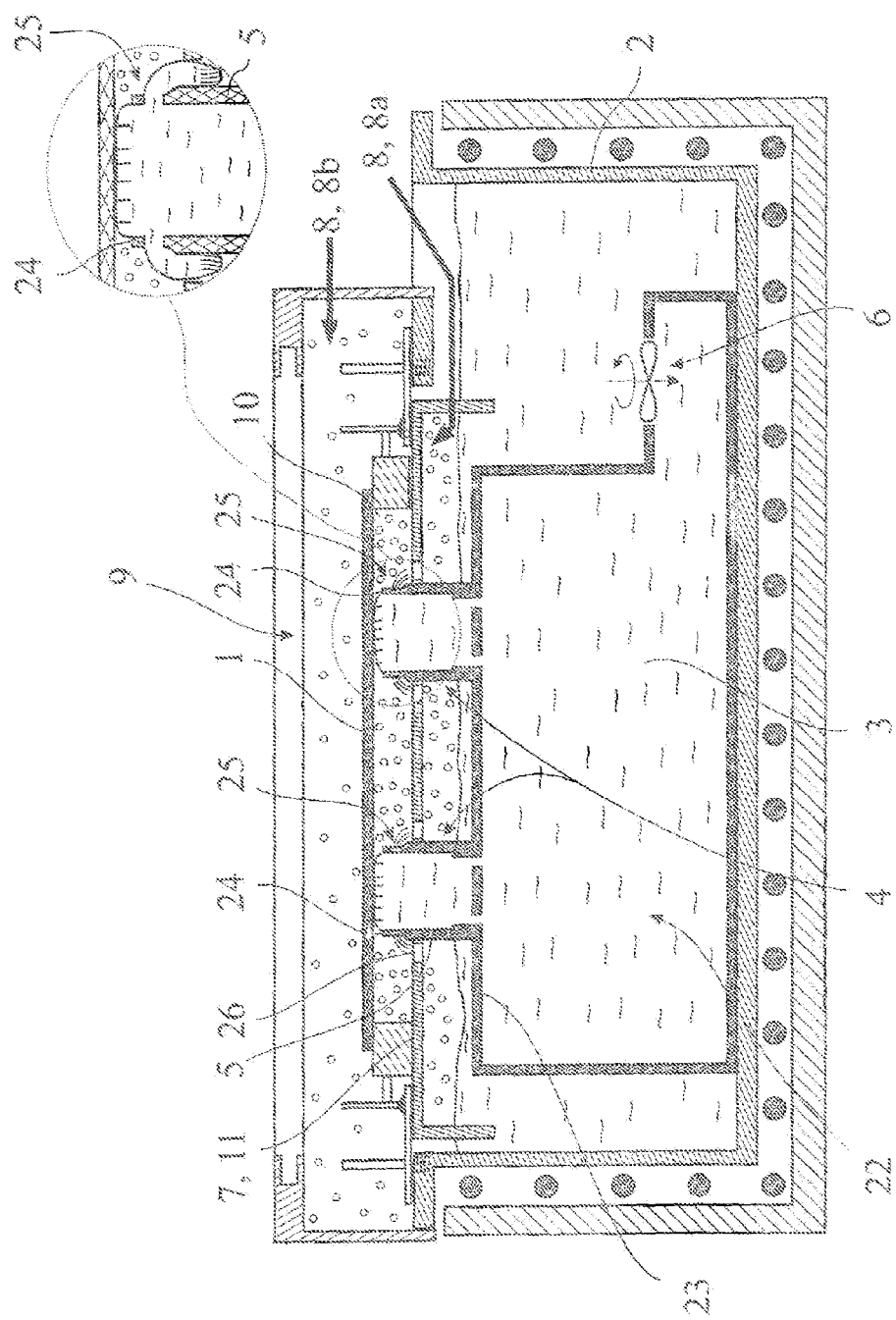
Figure 3:
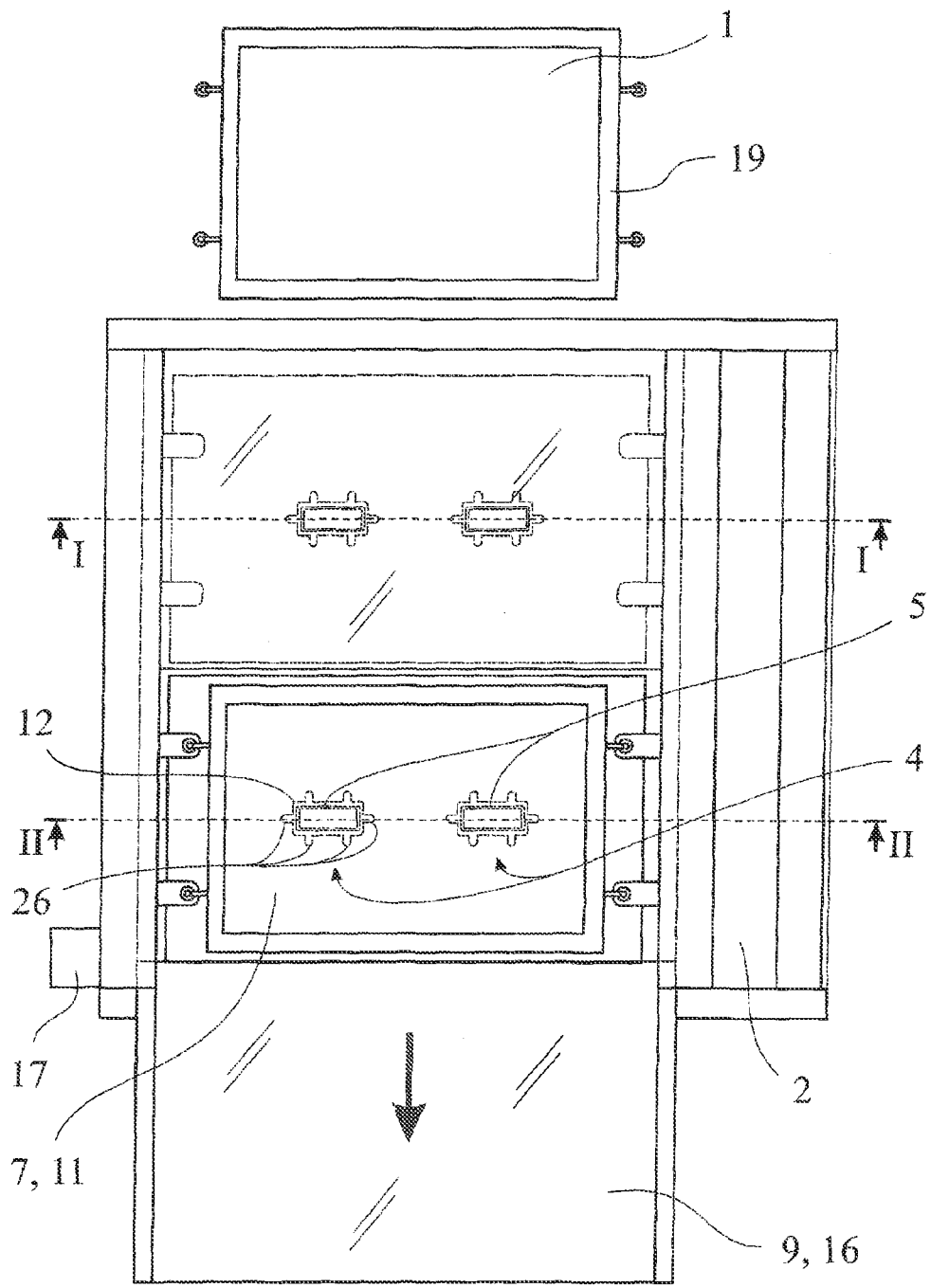

The invention is explained in more detail below by means of a drawing which illustrates only one exemplary embodiment and in which FIG. 1 shows a proposed soldering plant in standby operation in a sectional view along the sectional plane I-I illustrated in FIG. 3, FIG. 2 shows a sectional view of the soldering plant according to FIG. 1 in soldering operation along the sectional plane II-II illustrated in FIG. 3, and FIG. 3 shows the soldering plant according to FIG. 1 in a top view.

The selective soldering plant shown in the drawing serves for the soldering of electronic circuit boards 1. The selective soldering plant has at least one container 2 for liquid solder 3 and a soldering arrangement 4 with at least one soldering nozzle 5. To convey the liquid solder 3 to the soldering arrangement 4, in particular to the soldering nozzles 5, a pump 6 is provided, which is illustrated diagrammatically in FIG. 2.

FIG. 2 shows, further, that an inner shielding device 7 for at least partially shielding upwardly with regard to a gas flow is provided above the soldering arrangement 4.

The term "shielding" is to be understood broadly in the present context. It comprises all measures for suppressing an upward gas flow, and in this case the suppression of the gas flow may be provided completely with the effect of sealing off or else only partially.

Furthermore, the selective soldering plant is equipped with an inflow device 8, through which gas, in particular protective gas, can in any event flow into the region below the inner shielding device 7. It is conceivable here that the inflow device 8 causes the protective gas to flow in at various points, for example even above the inner shielding device 7. A first partial inflow direction 8a is provided here for inflow below the inner shielding device 7. A second partial inflow direction 8b is provided for inflow above the inner shielding device 7.

It is essential, then, that, in addition, an outer shielding device 9 is provided for at least partially shielding the region 9 above the inner shielding device 7 with regard to an upward gas flow. Here, too, the term "shielding" is to be understood broadly in the above sense.

The selective soldering plant can be transferred to standby operation in which soldering is not carried out. In standby operation, the proposed shielding devices 7, 9 are especially important. In standby operation, it is merely necessary to ensure that the dross formation referred to above is largely absent, so that subsequent soldering operation can proceed, as free of faults as possible.

In the exemplary embodiment illustrated and thus far preferred, the inner shielding device 7 is equipped with a cover plate 11 which, in the standby position (FIG. 1), is positioned above the soldering nozzles 5 and which can be lowered into a soldering position (FIG. 2) in such a way that the soldering nozzles 5 project through cover plate orifices 12 in the cover plate 11 which are assigned in each case to the soldering nozzles 5. In an also preferred refinement, the cover plate orifices 12 are such that, with the cover plate 11 lowered, only slit-like orifices remain between the cover plate 12 and the soldering nozzles 5.

It should be pointed out that the soldering arrangement 4 may be equipped with only one soldering nozzle 5 or, as here, with a plurality of soldering nozzles 5. Furthermore, there may be provision for each soldering nozzle 5 to be assigned a dedicated cover plate orifice in the cover plate 11. It is also conceivable, however, that a cover plate orifice 12 is assigned to a plurality of soldering nozzles 5. It is always a question below of a plurality of soldering nozzles 5. All versions apply accordingly to a soldering arrangement 4 having only a single soldering nozzle 5.

As a result of the above configuration of the inner shielding device 7, a stable low-oxygen atmosphere can be established below the inner shielding device 7 in the standby position. For soldering operation, the cover plate 11 is briefly lowered, so that the soldering nozzles 5 project out of the cover plate 11 for a short time. After soldering operation, the cover plate 11 is returned to the standby position.

What is expedient in the present case in the illustrated configuration of the inner shielding device 7 is that the cover plate 11 can be lowered by the action of force from outside, here by the action of force of a gripper 13 for the circuit board 1 to be soldered. For this purpose, the gripper 13 is equipped with lateral rams 14 which, when the gripper 13 is lowered, cooperate with those of the cover plate 11 or with a component coupled to the cover plate 11.

The cover plate 11 is prestressed into the standby position, upward in the drawing. The prestress is preferably spring prestress caused, for example, by compression springs 15 arranged laterally on the cover plate 11.

FIG. 3 shows that the outer shielding device 9 is closable (FIG. 1) and, in the closing position, essentially closes off outwardly the region below and above the inner shielding device 7 with regard to a gas flow.

When the selective soldering plant is in standby operation, the outer shielding device 9 is regularly closed, so that a low-oxygen atmosphere can be established below the outer shielding device 9 as a result of the inflow of protective gas via the inflow device 8. In the exemplary embodiment illustrated and thus far preferred, this atmosphere is set not only below the inner shielding device 7, but also, through the cover plate orifices 12, above the inner shielding device 7. As explained above, to reinforce this, inflow is carried out here by means of the two partial inflow devices 8a, 8b below and also above the inner shielding device 7. By the outer shielding device 9 being closed, a comparatively low volumetric flow of protective gas and only a short time are required in order to obtain the desired atmosphere.

For the soldering operation, the outer shielding device 9 is opened. For this purpose, the outer shielding device 9 is equipped with at least one closure element 16 which can be adjusted for closing and opening the shielding device 9.

Here and preferably, an actuator 17, such as an electric motor, a pneumatic cylinder or the like, is provided for adjustment. The closure element 16 may be configured (FIG. 3) in the manner of a door, here and preferably in the manner of a sliding door. In the exemplary embodiment illustrated and thus far preferred, two sliding doors 16 are provided, by means of which the opening of the outer shielding device 9 can be handled in an especially flexible way.

In an especially preferred refinement, the outer shielding device 9 is, if required, only partially closable and openable, so that only part of the region which can be shielded by the outer shielding device 9 is outwardly accessible. As a result, at least a maximum possible shielding action can be maintained even during soldering operation.

Consequently, it is preferably such that, in an open position, the outer shielding device 9 in any event exposes the region above the inner shielding device 7, completely or only partially, as required, so that the soldering arrangement 4 is accessible via the lowerable cover plate 11 for the gripper 13 which holds the circuit board 1 to be soldered.

As indicated above, for soldering operation, there is provision whereby, with the outer shielding device 9 opened, the gripper 13 positions at the soldering arrangement 4 the circuit board 1 to be soldered, at the same time comes into engagement nonpositively with the cover plate 11 or with a component coupled to the cover plate 11 and thereby lowers the cover plate 11 into the soldering position.

An especially advantageous refinement for the gripper of the selective soldering plant can be gathered from the illustration according to FIG. 2. It is essential in this case that, when the circuit board 1 to be soldered is being positioned at the soldering arrangement 4, the gripper 13 forms, together with the circuit board 1 to be soldered, a hood-like arrangement 18 for at least partially closing off the cover plate 11. This is implemented here and preferably in a simple way in that the gripper 13 forms an also preferably peripheral frame 19 with a lower margin 20, and in that the circuit board 1 is positioned so as to be offset upward with respect to the margin 20, so that the frame 20, together with the circuit board 1, forms the desired hood-like arrangement 18. The offset of the circuit board is indicated in FIG. 2 by reference symbol 21.

Numerous possibilities may be envisaged for the fundamental set-up of the proposed selective soldering plant. Provided here and preferably inside the container 2 for liquid solder is a duct 22 for the liquid solder 3, which duct issues into the soldering arrangement 4 with the at least one soldering nozzle 5, the pump 6 pumping liquid solder 3 into the duct 22.

This, too, can best be gathered from the illustration in FIG. 2.

The soldering arrangement 4 has here a baseplate 23 which may have a one-part or multipart configuration. The soldering nozzles 5 are arranged on the baseplate 23. The baseplate 23 closes off the duct 22 upwardly and enables solder 3 to be fed out of the duct 22 into the soldering nozzles 5.

It is expedient, further, in the selective soldering plant illustrated that the soldering nozzles 5 have in each case on their top side a nozzle outlet 24 for the provision of the solder 3 for the soldering process, at least one outflow orifice 25 emanating from the soldering nozzle 5 below the nozzle outlet 24. It is consequently possible to generate a soldering wave in the region of the nozzle outlet 24, without the need for the solder 3 to run over the margin of the nozzle outlet 24. In this context, reference should be made to German Utility Model Application DE 202 20 971 U1 which is attributable to the applicant and the content of which thus far becomes the subject matter of the present application.

In an especially preferred refinement, it is such that the cover plate 11 has at least one clearance 26 in the region of at least one outflow orifice 25, so that, with the cover plate 11 lowered, the outflow of solder 3 through the clearance 26 is possible. The at least one clearance 26 is designed preferably such that the solder 3 flowing out of the assigned outflow orifice 25 can flow exactly through the clearance 26. The at least one clearance 26 is located here and preferably at the margin of the assigned cover plate orifice 12.

Pursuant to further teaching, which likewise assumes independent significance, a method for the soldering of electronic circuit boards 1 by means of a proposed selective soldering plant is claimed. It is essential, pursuant to this further teaching, that, with the outer shielding device 9 closed, protective gas is in any event induced by means of the inflow device 8 to flow into the region below the inner shielding device 7, and that, subsequently, the outer shielding device is opened and the circuit board 1 to be soldered is positioned at the soldering arrangement 4 by means of a gripper 13. For details relating to the proposed method, reference should be made to the statements regarding the proposed selective soldering plant.

In an especially preferred refinement, the inner shielding device 7 is equipped, as described above, with a cover plate 11 which, in a standby position, is positioned above the soldering nozzles 5 and which is lowered into the likewise above-described soldering position as a result of the positioning of the circuit board 1 to be soldered, in such a way that the soldering nozzles 5 project through orifices in the cover plate 11 which are assigned in each case to the soldering nozzles 5. Thus far, too, reference should be made to the above statements.

The invention claimed is:

1. A selective soldering plant for soldering an article, comprising:
    a gripper for the article to be soldered;
    a container configured to contain liquid solder;
    a soldering arrangement including at least one soldering nozzle;
    a pump configured to convey the liquid solder to the soldering arrangement;
    an inner shielding device configured to at least partially shield against upward gas flow, the inner shielding device being lowerable by an action force of the gripper for the article to be soldered;
    an inflow device configured to allow protective gas to flow into the region below the inner shielding device; and
    an outer shielding device configured to shield at least partially a region above the inner shielding device with regard to the gas flow.

2. The selective soldering plant as claimed in claim 1, wherein the inner shielding device comprises a cover plate and a cover plate orifice, the cover plate is configured to move between a standby position above the soldering nozzle and a soldering position where the soldering nozzle projects through the cover plate orifice, and when the cover plate is in the soldering position, only a clearance is defined between the cover plate and the soldering nozzle.

3. The selective soldering plant as claimed in claim 2, wherein the cover plate is lowered by the action of force of a gripper for the article to be soldered.

4. The selective soldering plant as claimed in claim 2, wherein the cover plate is configured to be spring-prestressed into the standby position.

5. The selective soldering plant as claimed in claim 1, wherein the outer shielding device is operable to close off the region below and above the inner shielding device outwardly with regard to the gas flow.

6. The selective soldering plant as claimed in claim 1, wherein in that the outer shielding device comprises a closure element which is configured to be adjusted by an actuator for closing and opening the shielding device, and the closure element comprises a sliding door.

7. The selective soldering plant as claimed in claim 1, wherein the outer shielding device is configured to close and open at least partially, and a part of a shielded region is outwardly accessible.

8. The selective soldering plant as claimed in claim 7, wherein, when the outer shielding device opens the region above the inner shielding device exposes.

9. The selective soldering plant as claimed in claim 8, wherein when the outer shielding device opens, the gripper is operable to come into engagement with the cover plate or with a component couple to the cover plate and lower the cover plate into a soldering position, and the article is positioned at the soldering arrangement.

10. The selective soldering plant as claimed in claim 8, wherein when the outer shielding device opens, the gripper is operable to come into interaction with the cover plate, and wherein the gripper comprises a hood configured to at least partially close off the cover plate, the hood comprises a peripheral frame having a lower margin, and the article is positioned at the soldering arrangement so as to be offset upward with respect to the margin.

11. The selective soldering plant as claimed in claim 1, wherein the container comprises a duct for containing the liquid solder and communicating with the soldering arrangement and the soldering nozzle, wherein the pump pumps liquid solder into the duct.

12. The selective soldering plant as claimed in claim 11, wherein the soldering arrangement comprises a multipart baseplate, on which the soldering nozzle is arranged and which closes off the duct and the liquid solder is operable to be fed out of the duct into the soldering nozzle.

13. The selective soldering plant as claimed in claim 2, wherein the soldering nozzle comprises:
a nozzle outlet at a top side thereof configured to provide the solder for a soldering process; and
an outflow orifice configured to emanate from the soldering nozzle below the nozzle outlet,
wherein the lowered cover plate lies below the outflow orifice, and
the cover plate comprises at least one clearance in the region of the outflow orifice,
wherein when the cover plate is lowered the solder outflows through the clearance.

14. A method for selective soldering an article by the selective soldering plant as claimed in claim 1, comprising:
closing the outer shielding device;
inducing the gas by the inflow device to flow into the region below the inner shielding device;
opening the outer shielding device;
positioning the article to be soldered at the soldering arrangement by the gripper.

15. The method as claimed in claim 14, wherein the inner shielding device comprises a cover plate and a cover plate orifice, further comprising:
moving the cover plate between a standby position above the soldering nozzle and a soldering position where the soldering nozzle projects through the cover plate orifice, and when the cover plate is in the soldering position, only a clearance is defined between the cover plate and the soldering nozzle.

16. A selective soldering plant for soldering an article, comprising:
a container configured to contain liquid solder;
a soldering arrangement having a soldering nozzle, the soldering nozzle comprising a nozzle outlet at a top side thereof configured to provide the solder for a soldering process; and
an outflow orifice configured to emanate from the soldering nozzle below the nozzle outlet,
a pump configured to convey the liquid solder to the soldering arrangement;
an inner shielding device configured to shield at least partially the soldering arrangement upwardly with regard to a gas flow, the inner shielding device comprising a cover plate which lies below the outflow orifice, the cover plate comprising at least one clearance in the region of the outflow orifice and when the cover plate is lowered the solder outflows through the clearance;
an inflow device configured to allow the gas to flow into the region below the inner shielding device; and
an outer shielding device configured to shield at least partially a region above the inner shielding device with regard to the gas flow.

17. The selective soldering plant as claimed in claim 16, wherein the inner shielding device comprises a cover plate and a cover plate orifice, the cover plate is configured to move between a standby position above the soldering nozzle and a soldering position where the soldering nozzle projects through the cover plate orifice, and when the cover plate is in the soldering position, only a clearance is defined between the cover plate and the soldering nozzle.

18. The selective soldering plant as claimed in claim 17, wherein the cover plate is configured to be spring-prestressed into the standby position.

19. The selective soldering plant as claimed in claim 16, wherein the outer shielding device is operable to close off the region below and above the inner shielding device outwardly with regard to the gas flow.

20. The selective soldering plant as claimed in claim 16, wherein in that the outer shielding device comprises a closure element which is configured to be adjusted by an actuator for closing and opening the shielding device, and the closure element comprises a sliding door.

21. The selective soldering plant as claimed in claim 16, wherein the outer shielding device is configured to close and open at least partially, and a part of a shielded region is outwardly accessible.

22. The selective soldering plant as claimed in claim 21, wherein, when the outer shielding device opens the region above the inner shielding device exposes.

23. The selective soldering plant as claimed in claim 22, wherein when the outer shielding device opens, a gripper for the article to be soldered is operable to come into engagement with the cover plate or with a component couple to the cover plate and lower the cover plate into a soldering position, and the article is positioned at the soldering arrangement.

24. The selective soldering plant as claimed in claim 23, wherein when the outer shielding device opens, the gripper is operable to come into interaction with the cover plate, and wherein the gripper comprises a hood configured to at least partially close off the cover plate, the hood comprises a peripheral frame having a lower margin, and the article is positioned at the soldering arrangement so as to be offset upward with respect to the margin.

25. The selective soldering plant as claimed in claim 16, wherein the container comprises a duct for containing the liquid solder and communicating with the soldering arrangement and the soldering nozzle, wherein the pump pumps liquid solder into the duct.

26. The selective soldering plant as claimed in claim 25, wherein the soldering arrangement comprises a multipart baseplate, on which the soldering nozzle is arranged and which closes off the duct and the liquid solder is operable to be fed out of the duct into the soldering nozzle.

27. A selective soldering plant for the soldering of electronic circuit boards, comprising:
   at least one container adapted to contain liquid solder;
   a soldering arrangement with at least one soldering nozzle;
   at least one pump for conveying the liquid solder to the soldering arrangement;
   an inner shielding device configured to at least partially shield the soldering arrangement from upward gas flow, the inner shielding device being provided above the soldering arrangement, wherein the plant is configured to lower the inner shielding device to a position below a portion of the soldering arrangement;
   an inflow device configured to inflow protective gas into the region below the inner shielding device; and
   an outer shielding device configured to at least partially shield a region above the inner shielding device with regard to a gas flow,
   wherein the inner shielding device includes a cover plate, and
   wherein the plant is configured such that the cover plate can be lowered by the action of force from a gripper for the circuit board to be soldered.

28. The selective soldering plant as claimed in claim 27, wherein the plant is configured such that the outer shielding device is movable.

29. The selective soldering plant as claimed in claim 27, wherein the inner shielding device includes a cover plate which, in a standby position, is positioned above the at least one soldering nozzle and which can be lowered into a soldering position in such a way that the at least one soldering nozzle projects through a cover plate orifice of the inner shielding assigned to the soldering nozzle.

30. The selective soldering plant as claimed in claim 27, wherein the cover plate which, in a standby position, is positioned above the at least one soldering nozzle and which can be lowered into a soldering position in such a way that the at least one soldering nozzle projects through a cover plate orifice of the inner shielding assigned to the soldering nozzle such that with the cover plate lowered, only slit-like orifices remain between the cover plate and the at least one soldering nozzle.

31. The selective soldering plant as claimed in claim 26, wherein the plant is configured such that at least a portion of inner shielding device can be lowered by the action of force from a gripper for the circuit board to be soldered.

* * * * *